United States Patent
Shin

(10) Patent No.: US 8,445,318 B2
(45) Date of Patent: May 21, 2013

(54) PHASE CHANGE MEMORY DEVICES INCLUDING PHASE CHANGE LAYER FORMED BY SELECTIVE GROWTH METHODS AND METHODS OF MANUFACTURING THE SAME

(75) Inventor: Woong-chul Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 125 days.

(21) Appl. No.: 13/064,410

(22) Filed: Mar. 23, 2011

(65) Prior Publication Data

US 2011/0212568 A1     Sep. 1, 2011

Related U.S. Application Data

(62) Division of application No. 12/003,146, filed on Dec. 20, 2007, now abandoned.

(30) Foreign Application Priority Data

Jan. 23, 2007 (KR) .................. 10-2007-0007236

(51) Int. Cl.
    *H01L 21/06*      (2006.01)
(52) U.S. Cl.
    USPC ........... 438/102; 438/129; 438/585; 438/624; 257/4; 257/396; 257/E21.075
(58) Field of Classification Search
    USPC .. 438/102, 129, 585, 624, 800, 900; 257/1–4, 257/60, 396, E21.075
See application file for complete search history.

(56) References Cited

U.S. PATENT DOCUMENTS

| | | | | |
|---|---|---|---|---|
| 5,045,916 A * | 9/1991 | Vor et al. | ........................ | 257/383 |
| 7,394,087 B2 | 7/2008 | Kuh et al. | | |
| 2003/0209746 A1 | 11/2003 | Horii | | |
| 2005/0227496 A1 | 10/2005 | Park et al. | | |
| 2005/0277235 A1* | 12/2005 | Son et al. | ........................ | 438/166 |
| 2006/0072370 A1* | 4/2006 | Kuh et al. | ........................ | 365/232 |
| 2007/0099405 A1* | 5/2007 | Oliva et al. | ........................ | 438/585 |

FOREIGN PATENT DOCUMENTS

| | | |
|---|---|---|
| JP | 02-241032 | 9/1990 |
| JP | 2001-196563 | 7/2001 |
| JP | 2004-158852 | 6/2004 |
| JP | 2004-221595 | 8/2004 |

(Continued)

OTHER PUBLICATIONS

Office Action dated May 24, 2011 in corresponding Chinese Application No. 200810008555.5 and English translation thereof.

(Continued)

*Primary Examiner* — Evan Pert
*Assistant Examiner* — Mark A Laurenzi
(74) *Attorney, Agent, or Firm* — Harness, Dickey & Pierce, P.L.C.

(57) ABSTRACT

A phase change memory device including a phase change layer includes a storage node and a switching device. The switching device is connected to the storage node. The storage node includes a phase change layer selectively grown directly on a lower electrode. In a method of manufacturing a phase change memory device, an insulating interlayer is formed on a semiconductor substrate to cover a switching device. A lower electrode connected to the switching device is formed, and a phase change layer is selectively grown directly on the lower electrode.

13 Claims, 10 Drawing Sheets

FOREIGN PATENT DOCUMENTS

| | | |
|---|---|---|
| JP | 2007-501521 | 1/2007 |
| JP | 2007-180174 | 7/2007 |
| JP | 2007-294964 | 11/2007 |
| JP | 2008-004935 | 1/2008 |
| JP | 2008-505476 | 2/2008 |
| JP | 2008-515181 | 5/2008 |
| JP | 2008-141199 | 6/2008 |
| KR | 10-2006-0016312 | 2/2006 |
| WO | WO 2005/017905 | 2/2005 |
| WO | WO 2006/003620 | 1/2006 |
| WO | WO 2006/035325 | 4/2006 |

OTHER PUBLICATIONS

English Translation of KR 10-2006-0016312.
Chinese Office Action dated Aug. 23, 2010 for corresponding Chinese Patent Application No. 200810008555.5.
Korean Office Action dated Dec. 17, 2007 for corresponding Korean Patent Application No. 10-2007-0007236.
Jan. 29, 2013 Japanese Office Action issued in JP2008-004946.

* cited by examiner

PHASE CHANGE MEMORY DEVICES INCLUDING PHASE CHANGE LAYER FORMED BY SELECTIVE GROWTH METHODS AND METHODS OF MANUFACTURING THE SAME

PRIORITY STATEMENT

This application is a divisional under 35 U.S.C. §121 of U.S. application Ser. No. 12/003,146, filed on Dec. 20, 2007, now abandoned which claims priority under 35 U.S.C. §119 to Korean Patent Application No. 10-2007-0007236, filed on Jan. 23, 2007, in the Korean Intellectual Property Office, the entire contents of each of which are incorporated herein by reference.

BACKGROUND

Description of the Conventional Art

A conventional phase change material may transition between a crystalline state and an amorphous state according to temperature. The resistance of a phase change material in a crystalline state is lower than that in the amorphous state. The crystalline state and the amorphous state of the phase change material may be reversible. When a phase change material is applied to a memory device, the device is referred to as a phase change memory device A conventional phase change memory device may include a phase change material layer electrically connected to a source region or drain region of a transistor via a contact plug. The phase change memory device may be driven using a resistance difference resulting from a crystalline state change of the phase change material layer.

In a conventional manufacturing process, a storage node may be formed by sequentially etching an upper electrode and the phase change material layer after sequentially depositing the phase change material layer and the an upper electrode.

During a conventional manufacturing process, however, when etching the phase change material layer, a side of the phase change material layer may be damaged and the damage may affect the characteristics of the conventional phase change memory device. For example, an etching gas may penetrate into a relatively weak phase change material layer and an interface there below, which may negatively affect a program volume of the phase change material layer.

In another conventional phase change memory device, a relatively limited structure in which a phase change material layer is formed in a contact hole may have a lower reset current. In this conventional phase change memory device, an opening of the contact hole may be inhibited or blocked by an overhang while forming the phase change material layer within the contact hole. Accordingly, a seam or void may be formed in the phase change material layer. The seam or the void in the phase change material layer may increase a set resistance of the phase change material layer. Additionally, the size and shape of the seam or void may vary according to the difference of a contact hole profile of each cell. This may result in relatively large deviations in set resistance, reset resistance and/or a reset current between cells.

SUMMARY

Example embodiments relate to semiconductor memory devices, for example, phase change memory devices including a phase change layer formed by a selective growth method and methods of manufacturing the same.

Example embodiments provide phase change memory devices having reduced etching damage in a phase change material layer. Example embodiments also provide methods of manufacturing phase change memory devices.

At least one example embodiment provides a phase change memory device. According to at least this example embodiment, a storage node may include a phase change layer. A switching device may be connected to the storage node. The phase change layer may be selectively grown on a seed layer.

At least one other example embodiment provides a phase change memory device. According to at least this example embodiment, a storage node may include a phase change layer, and a switching device may be connected to the storage node. The phase change layer may be selectively grown on a lower electrode.

At least one other example embodiment provides a phase change memory device. According to at least this example embodiment, a storage node may include a lower electrode and a phase change layer. A switching device may be connected to the storage node. The lower electrode and the phase change layer may be sequentially stacked in the same contact hole.

According to example embodiments, the seed layer may be formed on a lower electrode. The seed layer may be a layer selected from the group consisting of or including a chalcogenide layer, an electrically conductive transition metal layer, a transition metal nitride layer, a ternary nitride layer, a metal oxide layer or the like. The phase change memory device may further include a lower electrode contact layer formed between the lower electrode and the seed layer.

According to at least some example embodiments, a portion of the lower electrode may be formed in a first portion of the contact hole and the phase change layer may be formed in a second portion of the contact hole. The contact hole may include the entire lower electrode and phase change layer. The lower electrode may include a lower electrode contact layer and a connection portion. The lower electrode contact layer may at least partially fill the contact hole. The connection portion may connect the lower electrode contact layer and the switching device.

At least one other example embodiment provides a method of manufacturing a phase change memory device. According to at least this example embodiment, an insulating interlayer may be formed on a semiconductor substrate. The insulating interlayer may be formed to cover a switching device. A lower electrode connected to the switching device may be formed. A lower electrode contact layer may be formed on the lower electrode. A phase change layer may be selectively grown on the lower electrode contact layer.

At least one other example embodiment provides a method of manufacturing a phase change memory device. According to at least this example embodiment, an insulating interlayer may be formed on a semiconductor substrate including a switching device. The insulating interlayer may be formed to cover the switching device. A lower electrode may be connected to the switching device. A phase change layer may be selectively grown on the lower electrode.

According to at least some example embodiments, an insulation layer may be formed after selectively growing the phase change layer. The insulation layer may surround a side wall of the phase change layer. The lower electrode contact layer may be formed by forming a seed layer on the lower electrode contact layer, and selectively growing the phase change layer on the seed layer. The insulation layer may be formed by forming an insulation layer covering the phase change layer, and planarizing a top surface of the insulation layer to expose the phase change layer.

According to at least some example embodiments, the seed layer may be a layer selected from the group consisting of or including a chalcogenide layer, an electrically conductive transition metal layer, a transition metal nitride layer, a ternary nitride layer, a transition metal oxide layer or the like. In at least this example embodiment, the chalcogenide layer may be a layer selected from the group consisting of or including a Ge layer, a Sb layer, a GeTe layer, a GeSbTe layer and the like.

According to at least some example embodiments, the lower electrode may be formed by forming an upper insulating interlayer including a contact hole, and forming the lower electrode contact layer and the phase change layer in the contact hole. The phase change layer may be formed by planarizing the phase change layer after sequentially forming the lower electrode contact layer and the phase change layer in the contact hole. The lower electrode contact layer may be a layer selected from the group consisting of or including a chalcogenide layer, an electrically conductive transition metal layer, a transition metal nitride layer, a silicide layer, a ternary nitride layer, a transition metal oxide layer and the like. The chalcogenide layer may be a layer selected from the group consisting of or including a Ge—Sb—Te—N layer, a As—Sb—Te—N layer, a As—Ge—Sb—Te—N layer, a Sn—Sb—Te—N layer, a (the group 5A element)-Sb—Te—N layer, a (the group 6A element)-Sb—Te—N layer, a (the group 5A element)-Sb—Se—N layer, a (the group 6A element)-Sb—Se—N layer and the like.

According to at least some example embodiments, the phase change layer may be a layer selected from the group consisting of or including a Ge—Sb—Te layer, a As—Sb—Te layer, a As—Ge—Sb—Te layer, a Sn—Sb—Te layer, a (the group 5A element)-Sb—Te layer, a (the group 6A element)-Sb—Te layer, a (the group 5A element)-Sb—Se layer, a (the group 6A element)-Sb—Se layer and the like.

According to at least some example embodiments, before forming the insulating interlayer, a transistor, a lower insulating interlayer, a contact pad layer and a conductive plug may be formed on the substrate. The transistor may include a source, a drain and a gate. The lower insulating interlayer may be formed to cover the transistor. The contact pad layer may be formed in the lower insulating interlayer. The contact pad layer may be connected to the source or the drain. A conductive plug may electrically connect the contact pad layer and the lower electrode.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
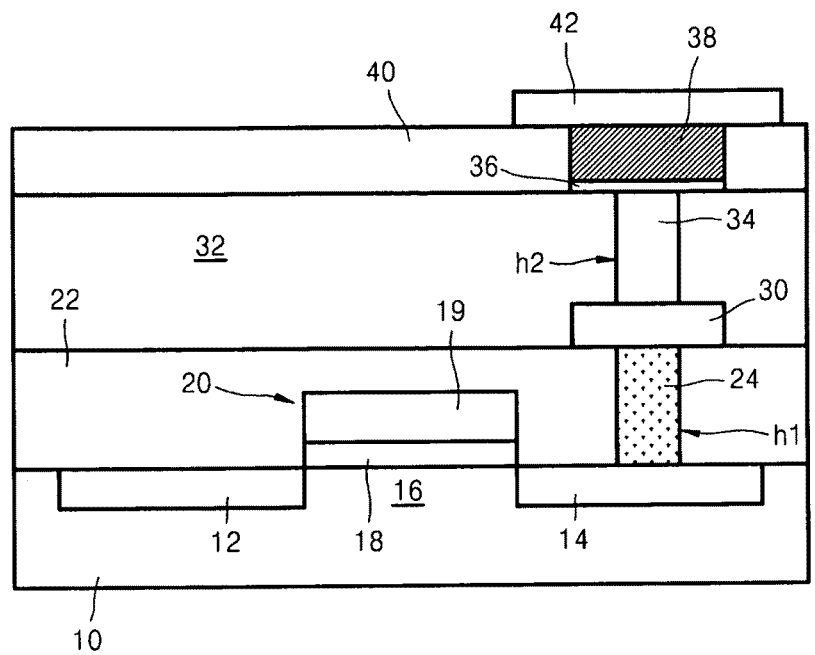
FIG. 1 is a sectional view of a phase change memory device according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a sectional view of a phase change memory device according to an example embodiment.

Referring to FIG. 1, first and second impurity regions 12 and 14 may be spaced apart from each other in a substrate 10. The substrate 10 may be an N-type or P-type semiconductor substrate. The first and second impurity regions 12 and 14 may be doped with an impurity opposite to that of the substrate 10. One of the first and second impurity regions 12 and 14 may be a source region and the other may be a drain region. A gate stack 20 may be formed on a substrate 10 between the first and second impurity regions 12 and 14. The gate stack 20 may include a gate insulation layer 18 and a gate electrode 19. The gate insulation layer 18 and the gate electrode 19 may be sequentially stacked on the substrate 10. A region below the gate stack 20 in the substrate 10 may be a channel region 16. The first and second impurity regions 12 and 14, the gate stack 20 and the channel region 16 may constitute a transistor or switching device. Although example embodiments will be discussed herein with regard to a transistor, other switching devices, such as a diode or the like may be used.

Still referring to FIG. 1, a first insulating interlayer 22 may be formed on the substrate 10. The first insulating interlayer 22 may be formed to cover the transistor. A first contact hole h1 may be formed in the first insulating interlayer 22 to expose at least a portion of the second impurity region 14. The first contact hole h1 may be filled with a conductive plug 24. A lower electrode 30 may be formed on the first insulating interlayer 22. The lower electrode 30 may be formed to cover a top surface of the conductive plug 24. The lower electrode 30 may be a TiN electrode, TiAlN electrode or the like. Alternatively, for example, the lower electrode 30 may be a silicide electrode including a metal ion selected from the group consisting of and including Ag, Au, Al, Cu, Cr, Co, Ni, Ti, Sb, V, Mo, Ta, Nb, Ru, W, Pt, Pd, Zn, Mg, a combination thereof and the like.

A second insulating interlayer 32 may be formed on the first insulating interlayer 22. The second insulating interlayer 32 may be formed to cover the lower electrode 30. The second insulating interlayer 32 may be formed of the same or substantially the same material as the first insulating interlayer 22. A second contact hole h2 may be formed in the second insulating interlayer 32. The second contact hole h2 may be formed to expose at least a portion of the lower electrode 30. The second contact hole h2 may be filled with a lower electrode contact layer 34. The lower electrode contact layer 34 may be a layer selected from the group consisting of or including a first transition metal layer, a first transition metal nitride layer, a first silicide layer, a first ternary nitride layer and the like. The first transition metal layer may be, for example, a Ti layer, a Zr layer, a Hf layer, a V layer, a Nb layer, a Ta layer, a W layer, a combination thereof or the like. The first transition metal nitride layer may be, for example, a TiN layer, a ZrN layer, a HfN layer, a VN layer, a NbN layer, a TaN layer, a WN layer a combination thereof or the like. The first silicide layer may be electrically conductive layer. For example, the first silicide layer may be a layer selected from the group consisting of or including a CoSi layer, a TiSi layer, Ta—Si layer, a Ni—Si layer, a combination thereof and the like. The first ternary nitride layer may be, for example, a layer selected from the group consisting of or including a TiAlN layer, a TaAlN layer, a TiSiN layer, a TaSiN layer, a TiCN layer, a TaCN layer a combination thereof and the like. The lower electrode contact layer 34 may be a chalcogenide layer, for example, a layer selected from the group consisting of or including a Ge—Sb—Te—N layer, a As—Sb—Te—N layer, a As—Ge—Sb—Te—N layer, a Sn—Sb—Te—N layer, a (the group 5A element)-Sb—Te—N layer, a (the group 6A element)-Sb—Te—N layer, a (the group 5A element)-Sb—Se—N layer, a (the group 6A element)-Sb—Se—N layer a combination thereof and the like.

A seed layer 36 may be formed on the second insulating interlayer 32. The seed layer 36 may be formed to cover a top surface of the lower electrode contact layer 34. The phase change layer 38 may be formed on the seed layer 36. The seed layer 36 and the phase change layer 38 may be surrounded by an insulation layer 40 formed on the second insulating interlayer 32. The upper electrode 42 may be formed on the insulation layer 40. The upper electrode 42 may be formed to cover a top surface of the phase change layer 38. An impurity layer (not shown) may be provided between the upper electrode 42 and the phase change layer 38. The impurity layer may be, for example, a diffusion barrier layer (not shown) for suppressing and/or preventing Ti diffusion.

The seed layer 36 may be a layer selected from the group consisting of or including a chalcogenide layer, an electrically conductive second transition metal layer, a second transition metal nitride layer, a second silicide layer, a second ternary nitride layer, a transition metal oxide layer, a combination thereof and the like. The chalcogenide layer may be a layer selected from the group consisting of or including a Ge layer, a Sb layer, a GeSbTe layer, a SbTe layer, a GeTe layer, a combination thereof and the like.

The second transition metal layer may be a layer selected from the group consisting of or including a Ti layer, a Zr layer, a Hf layer, a V layer, a Nb layer, a Ta layer, a W layer, a combination thereof and the like. The second transition metal nitride layer may be a layer selected from the group consisting of or including a TiN layer, a ZrN layer, a HfN layer, a VN layer, a NbN layer, a TaN layer, a WN layer, a combination thereof and the like. The second silicide layer may be a layer selected from the group consisting of or including a CoSi layer, a TiSi layer, a TaSi layer, a NiSi layer, a GeSi layer, a combination thereof and the like. The second ternary nitride layer may be a layer selected from the group consisting of or including a TiAlN layer, a TiCN layer, a TaCN layer, a TiSiN layer, a TaSiN layer, a combination thereof and the like. The transition metal oxide layer may be a layer selected from the group consisting of or including a $TiO_2$ layer, a $ZrO_2$ layer, a $HfO_2$ layer, a $V_2O_3$ layer, a NbO layer, a $Ta_2O_5$, a WO layer, a combination thereof and the like.

Still referring to FIG. 1, the phase change layer 38 may be formed on the seed layer 36 using a selective growth method. The phase change layer 38 may be, for example, a chalcogenide layer. For example, the phase change layer 38 may be a layer selected from the group consisting of or including a Ge—Sb—Te layer, a As—Sb—Te layer, a As—Ge—Sb—Te layer, a Sn—Sb—Te layer, a (the group 5A element)-Sb—Te layer, a (the group 6A element)-Sb—Te layer, a (the group 5A element)-Sb—Se layer, a (the group 6A element)-Sb—Se layer, a combination thereof and the like. If the phase change layer 38 is a Ge—Sb—Te layer, the phase change layer 38 may be a $Ge_2Sb_2Te_5$ layer, for example.

Figure 2:
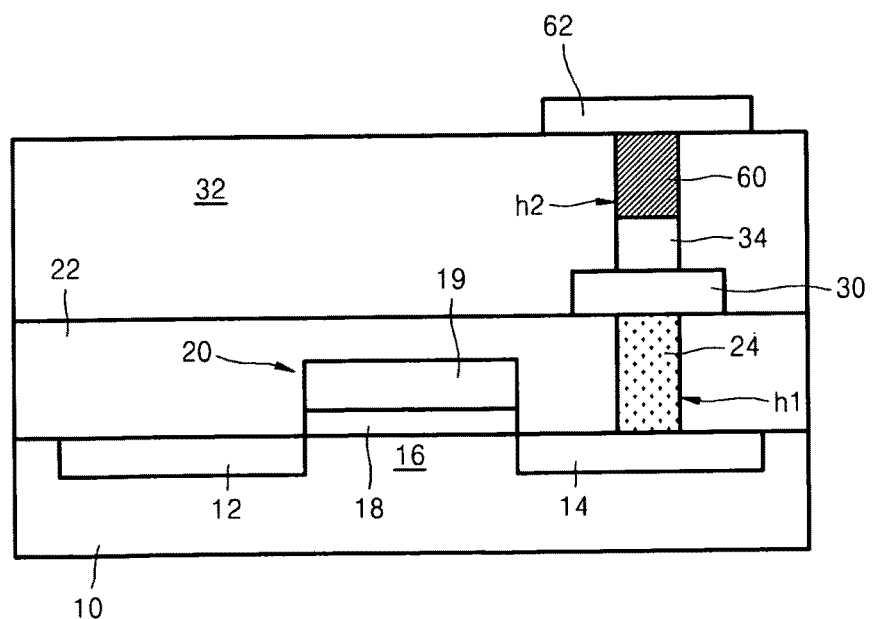
FIG. 2 is a sectional view of a phase change memory device according to an example embodiment.

FIG. 2 is a sectional view of a phase change memory device according to another example embodiment. In a storage node according to at least this example embodiment, a lower electrode contact layer and a phase change layer may be formed in a second contact hole h2. Details of this example embodiment that are the same as that of the example embodiment shown in FIG. 1 will be omitted for the sake of brevity.

Referring to FIG. 2, the lower electrode contact layer 34 may be formed to fill a first portion of the second contact hole h2. A phase change layer 60 may be formed to fill the remaining (e.g., second) portion of the second contact hole h2. The phase change layer 60 may be selectively grown (e.g., only) on the lower electrode contact layer 34 using a selective growth method. The phase change layer 60 may be formed of the same or substantially the same material as that of the phase change layer 38 according to the example embodiment illustrated in FIG. 1. An upper electrode 62 may be formed on a second insulating interlayer 32 to cover an exposed surface of the phase change layer 60. Although not illustrated in FIG. 2, the lower electrode contact layer 34 may be directly connected to a conductive plug 24. In this example, the lower electrode contact layer 34 may serve as a lower electrode. Alternatively, the lower electrode contact layer 34 may be regarded as a portion of the lower electrode 30 extending into the second contact hole h2. For example, the lower electrode contact layer 34 and the lower electrode 30 together may be regarded as a lower electrode corresponding to the upper electrode 62.

Methods of manufacturing a phase change memory device according to example embodiments will now be described.

FIGS. 3 through 7 are sectional views illustrating a method of manufacturing a phase change memory device according to an example embodiment. The method shown in FIGS. 3 through 7 may be used to manufacture an example embodiment of a phase change memory device as shown in FIG. 1.

Figure 3:
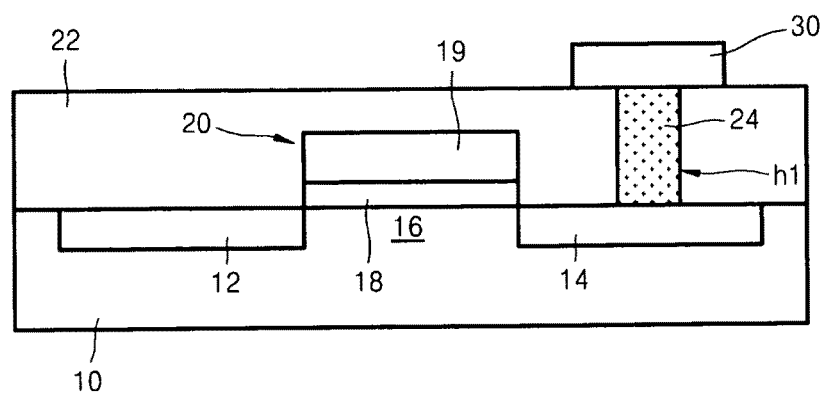
FIGS. 3 through 7 are sectional views illustrating a method of manufacturing a phase change memory device according to an example embodiment.

Referring to FIG. 3, the gate stack 20 may be formed on the substrate 10. The gate insulation layer 18 and the gate electrode 19 may be sequentially stacked to form the gate stack 20. A gate spacer (not shown) may be formed on a side wall of the gate stack 20. The substrate 10 may be an N-type or P-type semiconductor substrate. The gate stack 20 may be used as a mask to dope a conductive impurity into the substrate 10. The conductive impurity may be a type opposite to that of the substrate 10. First and second impurity regions 12 and 14, which may be spaced apart from each other, may be formed in the substrate 10 by doping. One of the first and second impurity regions 12 and 14 may serve as a source region and the other may server as a drain region. A region of the substrate 10 between the first and second impurity regions 12 and 14 may serve as the channel region 16.

An impurity may be doped into the channel region 16 to control a threshold voltage. The gate stack 20 and the first and second impurity regions 12 and 14 may constitute a transistor. Although example embodiments are described with regard to a transistor as the switching device, alternative switching devices, such as, a diode may be used.

Still referring to FIG. 3, the first insulating interlayer 22 may be formed on the substrate 10. The first insulating interlayer 22 may be formed to cover the gate stack 20. The first contact hole h1 may be formed in the first insulating interlayer 22 to expose at least a portion of the second impurity region 14. Alternatively, the first contact hole h1 may be formed to expose at least a portion of the first impurity region 12. According to example embodiments, although not illustrated, in addition to the first contact hole h1, another contact hole may be formed to expose at least a portion of the other of the first and second impurity regions 12 and 14. The first contact hole h1 may be filled with the conductive plug 24. The other contact hole (not shown) may also be filled with the conductive plug 24.

A first contact pad layer (not shown), connected to the second impurity region 14, may be formed between the conductive plug 24 and the second impurity region 14. The conductive plug 24 may also be formed on the first contact pad layer.

A second contact pad layer (not shown), connected to the first impurity region 12, may also be formed between a conductive plug in the other contact hole (not shown) and the first impurity region 12. In this example, the conductive plug may also be formed on the second contact pad layer.

After forming the conductive plug 24, the lower electrode 30 may be formed on the first insulating interlayer 22. The lower electrode 30 may be formed to cover an exposed surface of the conductive plug 24. The lower electrode 30 may be formed of a TiN electrode, a TiAlN electrode or the like. For example, alternatively, the lower electrode 30 may be formed as a silicide electrode including a metal ion selected from the group consisting of or including Ag, Au, Al, Cu, Cr, Co, Ni, Ti, Sb, V, Mo, Ta, Nb, Ru, W, Pt, Pd, Zn, Mg, a combination thereof and the like.

Figure 4:
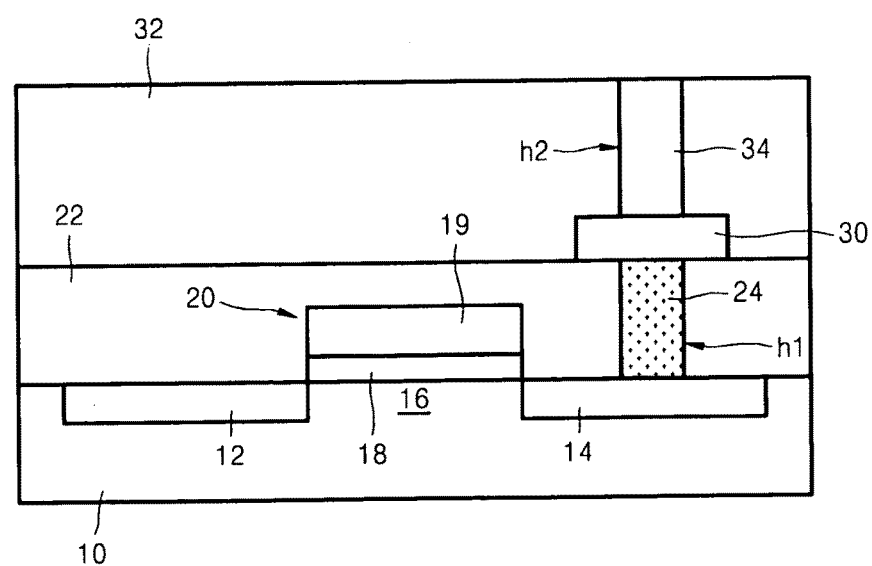

Referring to FIG. 4, the second insulating interlayer 32 may be formed on the first insulating interlayer 22. The second insulating interlayer 32 may be formed to cover the lower electrode 30. The first insulating interlayer 22 may be referred to as a lower insulating interlayer, and the second insulating interlayer 32 may be referred to as an upper insulating interlayer. The second insulating interlayer 32 may be formed of the same or substantially the same material as the first insulating interlayer 22. For example, the second insulating interlayer 32 may be formed of a silicon oxide layer or the like. The second contact hole h2 may be formed in the second insulating interlayer 32, and may expose at least a portion of the lower electrode 30. The second contact hole h2 may be filled with the lower electrode contact layer 34. The lower electrode contact layer 34 may be a layer selected from the group consisting of or including a first transition metal layer, a first transition metal nitride layer, a first silicide layer, a first ternary nitride layer, a combination thereof and the like.

The first transition metal layer may be a layer selected from the group consisting of or including a Ti layer, a Zr layer, a Hf layer, a V layer, a Nb layer, a Ta layer, a W layer, a combination thereof or the like. The first transition metal nitride layer may be a layer selected from the group consisting of or including a TiN layer, a ZrN layer, a HfN layer, a VN layer, a NbN layer, a TaN layer, a WN layer, a combination thereof and the like. The first silicide layer may be electrically conductive, for example, a layer selected from the group consisting of or including a CoSi layer, a TiSi layer, Ta—Si layer, a Ni—Si layer, a combination thereof and the like. The first ternary nitride layer may be a layer selected from the group consisting of or including a TiAlN layer, a TaAlN layer, a TiSiN layer, a TaSiN layer, a TiCN layer, a TaCN layer, a combination thereof and the like. The lower electrode contact layer 34 may be a chalcogenide, for example, a layer selected from the group consisting of or including a Ge—Sb—Te—N layer, a As—Sb—Te—N layer, a As—Ge—Sb—Te—N layer, a Sn—Sb—Te—N layer, a (the group 5A element)-Sb—Te—N layer, a (the group 6A element)-Sb—Te—N layer, a (the group 5A element)-Sb—Se—N layer, a (the group 6A element)-Sb—Se—N layer, a combination thereof and the like.

The structure formed below the second insulating interlayer 32 and the lower electrode 30 is omitted from FIG. 5 for the sake of brevity and clarity.

Figure 5:
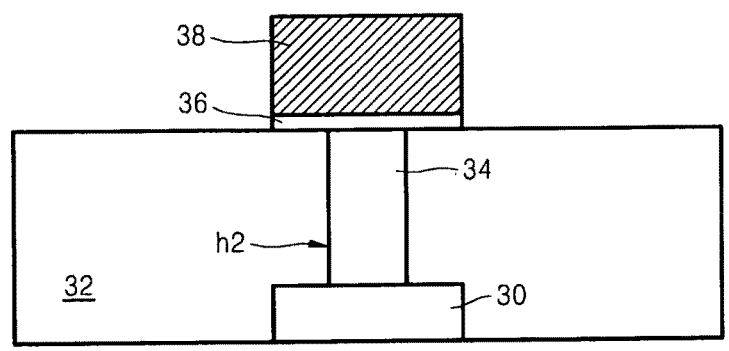

Referring to FIG. 5, the seed layer 36 may be formed on the second insulating interlayer 32. The seed layer 36 may cover the top surface of the lower electrode contact layer 34. The seed layer 36 may be formed (e.g., only formed) on the lower electrode contact layer 34 and a first region around the lower electrode contact layer 34. The phase change layer 38 may be formed on the seed layer 36. The phase change layer 38 may have a diameter corresponding to the diameter of the seed layer 36. The diameter of the phase change layer 38 may affect (e.g., directly affect) a reset current. This may be considered when forming the seed layer 36 and/or the phase change layer 38.

According to example embodiments, the seed layer 36 may be a layer selected from the group consisting of or including a chalcogenide layer, an electrically conductive second transition metal layer, a second silicide layer, a second transition metal nitride layer, a silicide layer, a second ternary nitride layer, a transition metal oxide layer, a combination thereof and the like. The chalcogenide layer may be a layer selected from the group consisting of or including a Ge layer, a Sb layer, a GeSbTe layer, a SbTe layer, a GeTe layer, a combination thereof and the like. The second transition metal layer may be a layer selected from the group consisting of or including a Ti layer, a Zr layer, a Hf layer, a V layer, a Nb layer, a Ta layer, a W layer, a combination thereof and the like. The second transition metal nitride layer may be a layer selected from the group consisting of or including a TiN layer, a ZrN layer, a HfN layer, a VN layer, a NbN layer, a TaN layer, a WN layer, a combination thereof and the like.

The second silicide layer may be a layer selected from the group consisting of or including a CoSi layer, a TiSi layer, a TaSi layer, a NiSi layer, a GeSi layer, a combination thereof and the like. The second ternary nitride layer may be a layer selected from the group consisting of or including a TiAlN layer, a TiCN layer, a TaCN layer, a TiSiN layer, a TaSiN layer, a combination thereof and the like. The transition metal oxide layer may be one layer selected from the group consisting of or including a $TiO_2$ layer, a $ZrO_2$ layer, a $HfO_2$ layer, a $V_2O_3$ layer, a NbO layer, a WO layer a combination thereof and the like.

The phase change layer 38 may be selectively grown on the seed layer 36. The phase change layer 38 may be formed using, for example, a metal organic chemical vapor deposition (MOCVD) method, an atomic layer deposition (ALD) method or the like. In at least this example embodiment, an etching selectivity of the phase change layer 38 may be greater than that of the second insulating interlayer 32 around the seed layer 36. As a result, while forming the phase change layer 38, the phase change layer 38 may grow only on the seed layer 36 but not on the second insulating interlayer 32. The phase change layer 38 may be a chalcogenide layer. For example, the phase change layer 38 may be a layer selected from the group consisting of or including a Ge—Sb—Te layer, a As—Sb—Te layer, a As—Ge—Sb—Te layer, a Sn—Sb—Te layer, a (the group 5A element)-Sb—Te layer, a (the group 6A element)-Sb—Te layer, a (the group 5A element)-Sb—Se layer, a (the group 6A element)-Sb—Se layer, a combination thereof and the like. If the phase change layer 38 is a Ge—Sb—Te series layer, the phase change layer 38 may be a $Ge_2Sb_2Te_5$ layer, for example.

Figure 6:
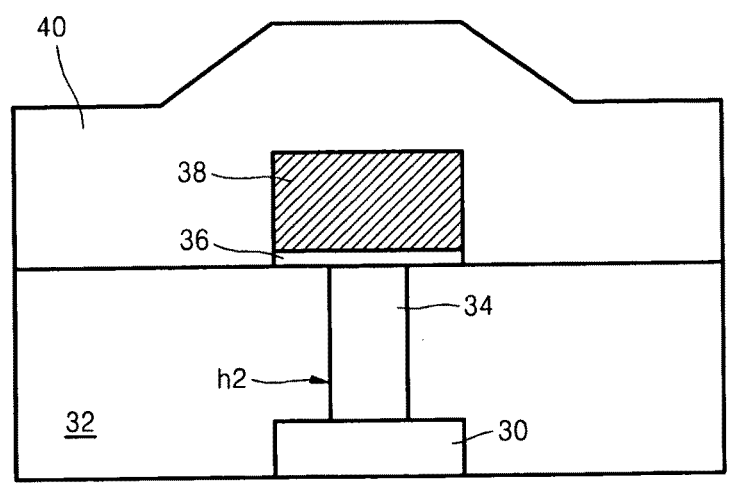

Referring to FIG. 6, after forming the phase change layer 38 to a first height, the insulation layer 40 may be formed on the second insulating interlayer 32. The insulation layer 40 may be formed to surround the phase change layer 38 and the seed layer 36. The insulation layer 40 may be thicker than the total thickness of the seed layer 36 and the phase change layer 38. The insulation layer 40 may be a silicon oxide layer or the like. After forming the insulation layer 40, the surface of the insulation layer 40 may be planarized by using a chemical mechanical polishing (CMP, or similar) method to expose the phase change layer 38 as shown in FIG. 7.

Figure 7:
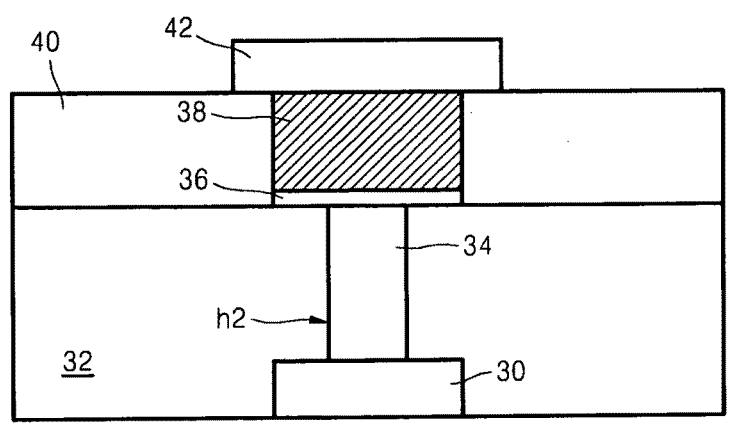

Referring to FIG. 7, after planarizing the insulation layer 40, the upper electrode 42 may be formed on the planarized insulation layer 40. The upper electrode 42 may be formed to cover the exposed top surface of the phase change layer 38. A diffusion barrier layer (not shown) may be formed between the top electrode 42 and the phase change layer 38. The diffusion barrier layer may suppress and/or prevent an impurity (e.g., Ti) from diffusing from the upper electrode 42 into the phase change layer 38. The upper electrode 42 may be deposited by using a sputtering (or similar) method. The upper electrode 42 may be formed of TiN or the like.

The upper electrode 42, the phase change layer 38, the lower electrode contact layer 34 and the lower electrode 30 may be a storage node for storing data. In the storage node, the lower electrode 30 may be formed of the same or substantially the same material as the lower electrode contact layer 34. Alternatively, the lower electrode contact layer 34 may contact (e.g., directly contact) the second impurity region 14.

As described above, in methods of manufacturing phase change memory devices according to example embodiments, an etching process with respect to the phase change layer 38 need not be performed, for example, with regard to the side wall of the phase change layer 38 while forming the storage node.

After the forming of the upper electrode 42, the memory device may be completed using conventional methods and procedures.

Figure 8:
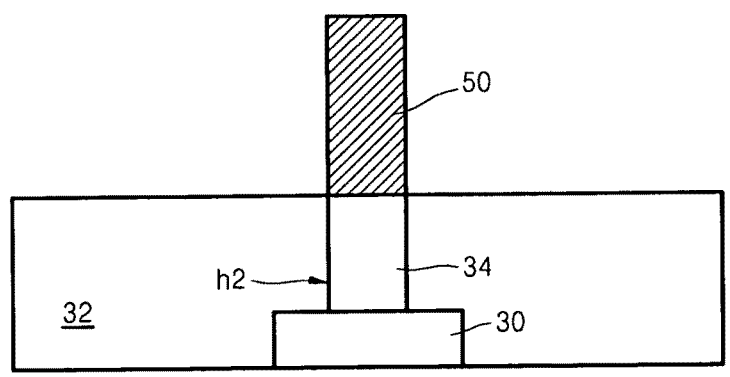
FIGS. 8 through 10 are sectional views illustrating a method of manufacturing a phase change memory device according to an example embodiment.
Figure 9:
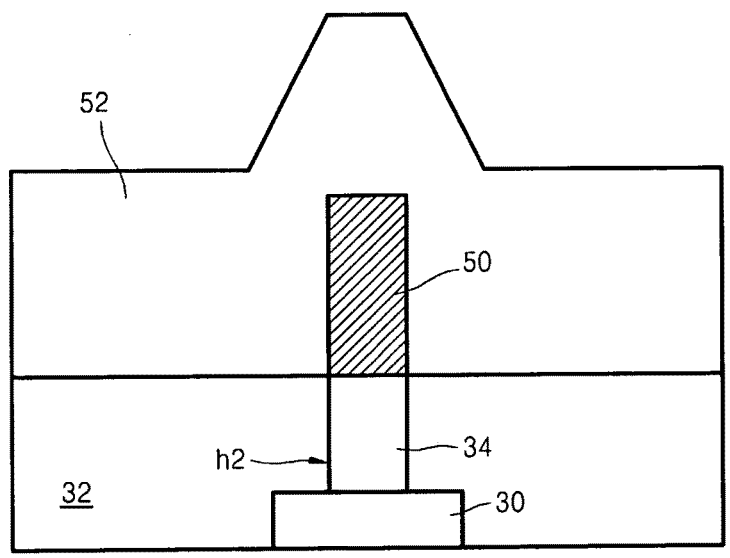
Figure 10:
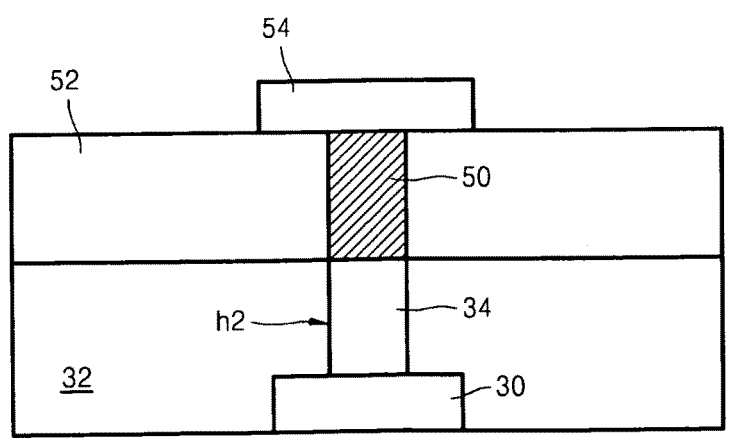

FIGS. 8 through 10 are sectional views illustrating a method of manufacturing a phase change memory device according to an example embodiment. The example manufacturing method shown in FIGS. 8 through 10 may be characterized by selectively forming (or growing) a phase change layer only on a lower electrode contact layer 34.

Referring to FIG. 8, the second contact hole h2 may be formed in a second insulating interlayer 32, and the second contact hole h2 may be filled with a lower electrode contact layer 34 in the same or substantially the same manner as described above with regard to FIGS. 3 through 7. The material of the lower electrode contact layer 34 may be the same or substantially the same as that of the lower electrode contact layer 34 shown in FIGS. 3 through 7. A phase change layer 50 may be selectively formed (e.g., grown) on the lower electrode contact layer 34. The phase change layer 50 may be formed of a material and using the same or substantially the same method as the phase change layer 38 discussed above with regard to FIGS. 5 through 7.

Referring to FIG. 9, an insulation layer 52 may be formed on the second insulating interlayer 32. The insulation layer 52 may be formed to cover the phase change layer 50. The insulation layer 52 may be formed of the same or substantially the same material as the insulation layer 40 discussed above with regard to FIGS. 6 through 7. The insulation layer 52 may be formed thicker than the phase change layer 50. After forming the insulation layer 52, the surface of the insulation layer 52 may be planarized to expose a top surface of the phase change layer 50.

Referring to FIG. 10, an upper electrode 54 may be formed on the planarized insulation layer 52. The upper electrode 54 may cover the exposed region of the phase change layer 50. The upper electrode 54 may be formed of the same or substantially the same material as the upper electrode 42 discussed above with regard to FIG. 7.

FIGS. 11 through 15 are sectional views illustrating a method of manufacturing a phase change memory device according to an example embodiment. At least this example manufacturing method may be used to manufacture the phase change memory device shown in FIG. 2.

Figure 11:
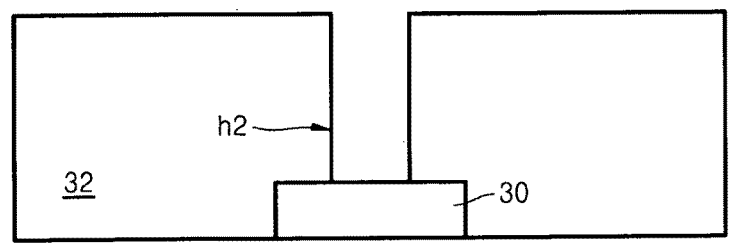
FIGS. 11 through 15 are sectional views illustrating a method of manufacturing a phase change memory device according to an example embodiment.

Referring to FIG. 11, the example manufacturing method of the phase change memory device shown in FIGS. 3 and 4 may be performed until the second contact hole h2 is formed in the second insulating interlayer 32 to expose the lower electrode 30. The second insulating interlayer 32 may be a layer selected from the group consisting of or including a silicon oxide layer, a silicon nitride layer, silicon oxy nitride (SiON) layer, a combination thereof and the like.

Figure 12:
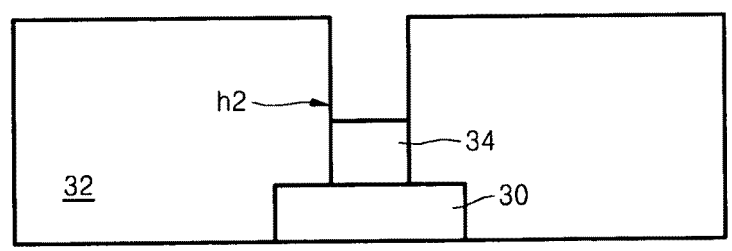

Referring to FIG. 12, a first portion of the second contact hole h2 may be filled with at least a portion of the lower electrode contact layer 34. The lower electrode contact layer 34 may be formed of the same or substantially the same material as the lower electrode contact layer of the phase change memory devices according to example embodiments.

Figure 13:
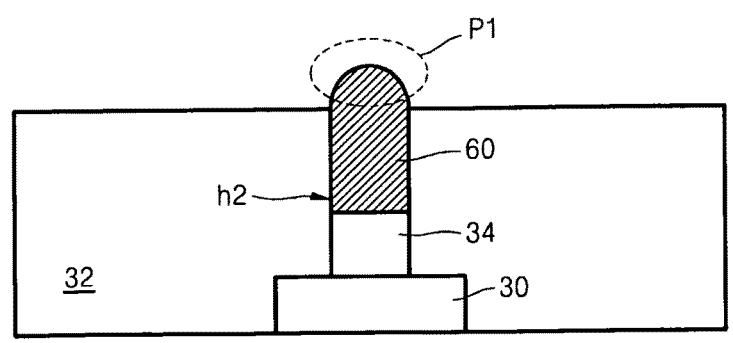

Referring to FIG. 13, the remaining (e.g., second) portion of the second contact hole h2 may be filled with the phase change layer 60. The phase change layer 60 may be selectively formed or grown (e.g., only formed) in the second contact hole h2 by using the same or substantially the same method as that used to form the phase change layer 38. A portion P1 of the phase change layer 60 may be removed using a planarization process. The portion P1 of the phase change layer 60 may be a portion protruding above the top surface of the second insulating interlayer 32. This planarization process may be, for example, a chemical-mechanical polishing (CMP) method or the like.

Figure 14:
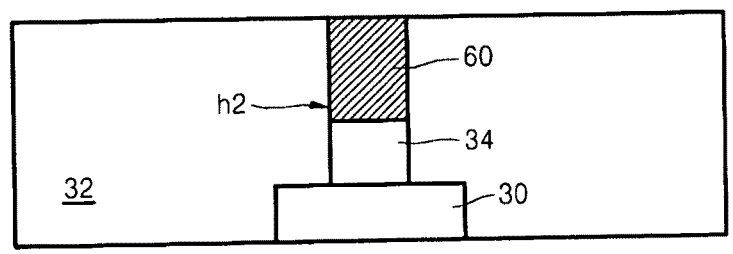

Referring to FIG. 14, the protruding portion P1 of the lower electrode contact layer 60 may be removed, and the exposed surface of the phase change layer 60 may be level or substantially level with the top surface of the second insulating interlayer 32.

Figure 15:
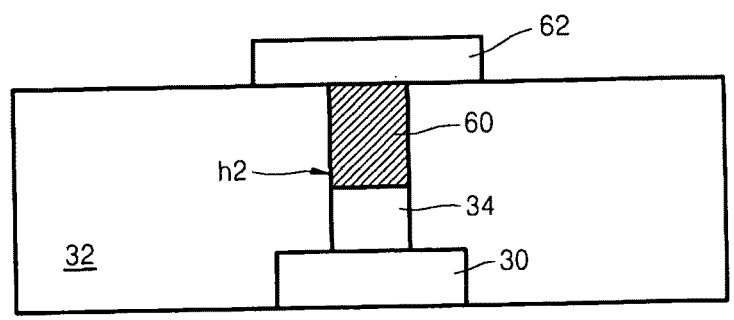

Referring to FIG. 15, the upper electrode 62 may be formed on the second insulating interlayer 32. The upper electrode 62 may be formed to cover the exposed surface of the phase change layer 60. The upper electrode 62 may be formed of the same or substantially the same material as the upper electrode 42. After forming the upper electrode 62, the memory device may be completed using conventional methods and procedures.

In methods of manufacturing phase change memory devices according to example embodiments, if the phase change layers (e.g., 38, 50 and/or 60) are GST layers and formed using a MOCVD method, (dtbeda) Ge (II), Sb (i-Pr) 3, and Te (t-Bu) 2 may be used as source gases of Ge, Sb, and Te, respectively. In this example, dtbeda denotes di-tert-butylethylenediamide, i-Pr denotes isopropyl group, and t-Bu denotes tert-butyl group, respectively. A deposition temperature may be between about 220° C. and about 330° C., inclusive, and the pressure may be about 5 torr.

Figure 16:
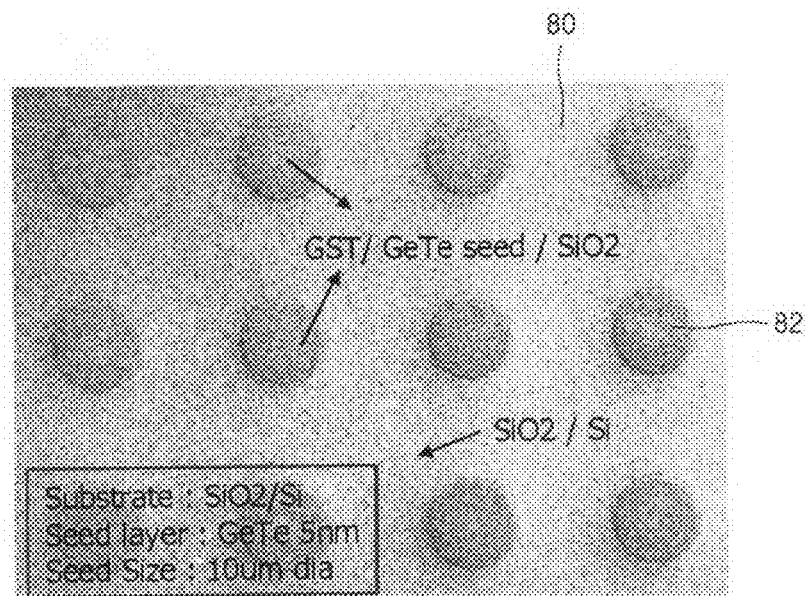
FIG. 16 is a scanning electron microscopic photograph of a $Ge_2Sb_2Te_5$ (GST) layer selectively formed on a seed layer in a phase change memory device manufactured using the example embodiment shown in FIGS. 3 through 7.
Figure 17:
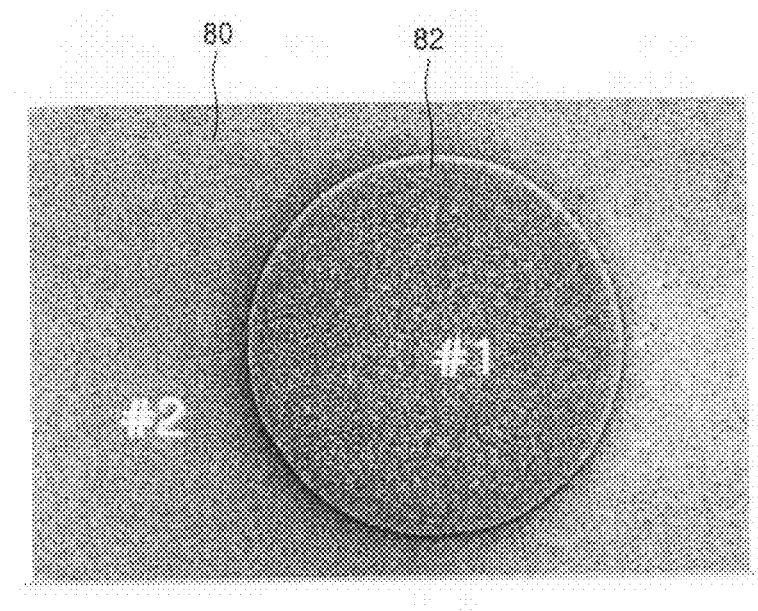
FIG. 17 is a photograph showing regions selected for analyzing components in the scanning electron microscopic photograph of FIG. 16.
Figure 18:
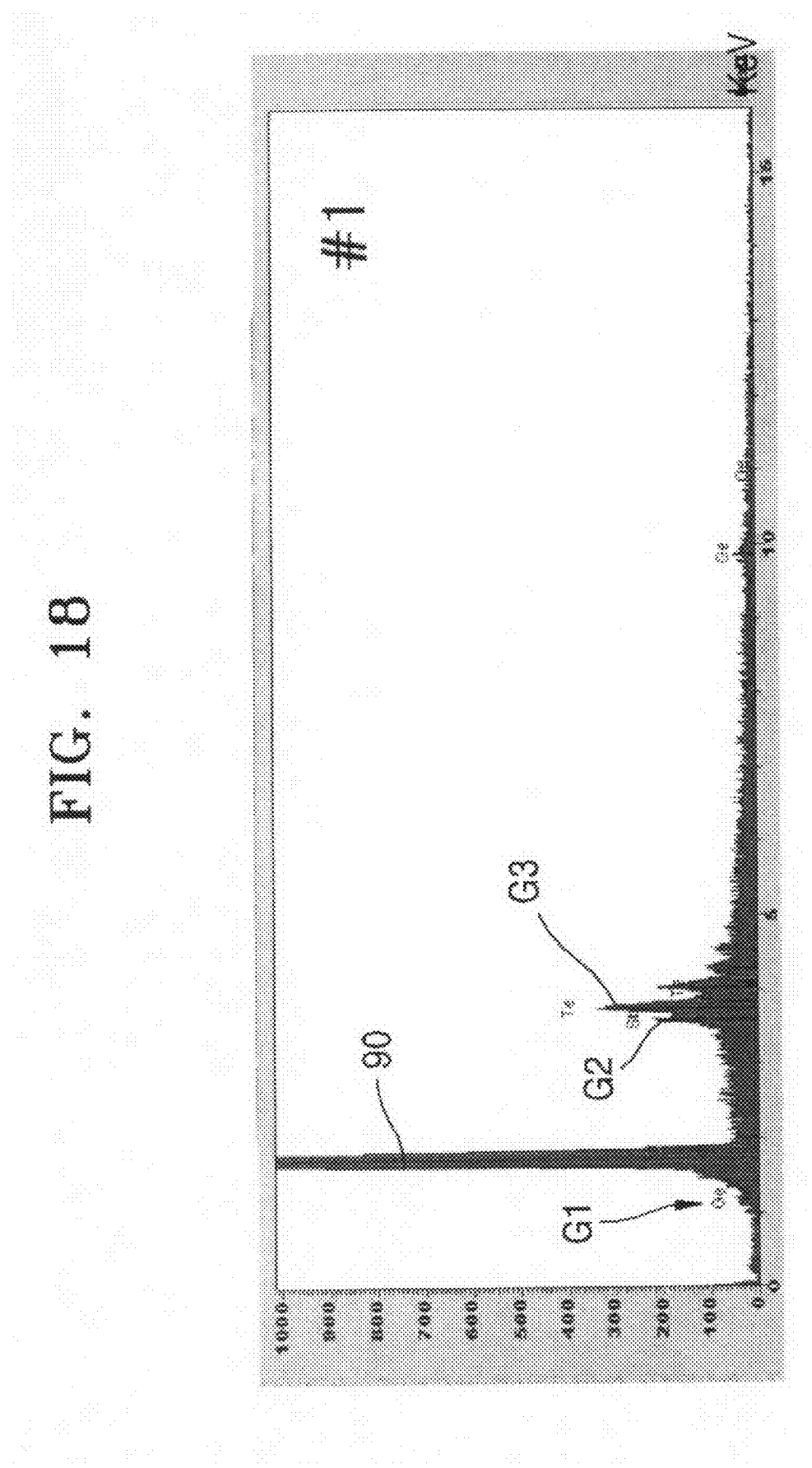
FIG. 18 is a graph of the components analysis result at the first point #1 of FIG. 17 having a GST layer on a seed layer.
Figure 19:
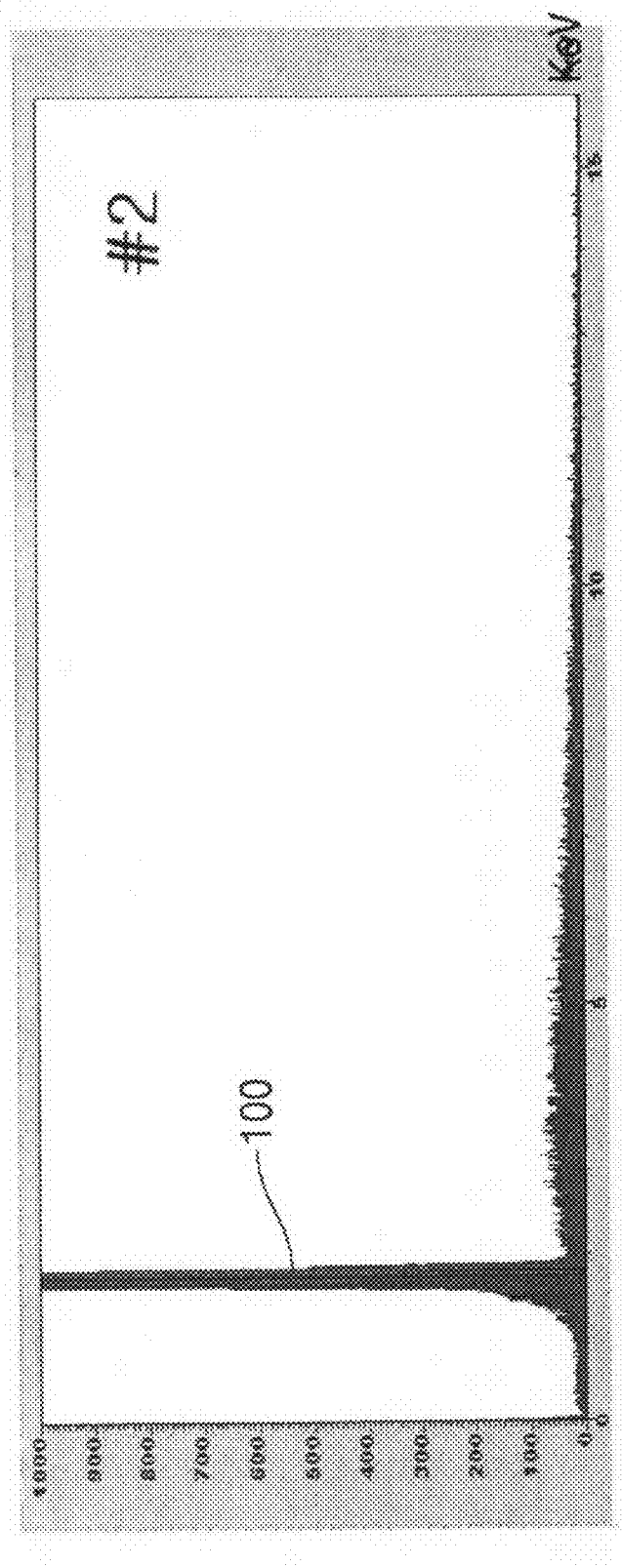
FIG. 19 is a graph of the components analysis result at the second point #2 of FIG. 17 around a seed layer without a GST layer.

FIG. 16 is a scanning electron microscopic photograph of a $Ge_2Sb_2Te_5$ (GST) layer selectively formed on a seed layer in a phase change memory device manufactured using the example embodiment shown in FIGS. 3 through 7. FIG. 17 is a photograph showing regions selected for analyzing components in the scanning electron microscopic photograph of FIG. 16. FIG. 18 is a graph of the components analysis result at the first point #1 of FIG. 17 having a GST layer on a seed layer, and FIG. 19 is a graph of the components analysis result at the second point #2 of FIG. 17 around a seed layer without a GST layer.

In obtaining the above-discussed experimental results, a silicon substrate, on which a silicon oxide layer is deposited, is used as the substrate, a plurality of circular seed layers are formed on the substrate spaced apart from each other. A GeTe layer is used as the seed layer. The thickness of the seed layer is 5 nm, its diameter is 10 μm, and a GST layer is grown on the seed layer using a MOCVD method under the above process conditions.

Referring to FIG. 16, reference numeral 80 denotes the silicon oxide on the silicon substrate, and reference numeral 82 denotes the GST layers on the seed layers. The GST layers 82 are formed only on the circular seed layers. Because the GST layers 82 are grown on the seed layers, the seed layers are not shown in FIG. 16.

To confirm that the GST layers 82 of FIG. 16 are formed only on the seed layers, as illustrated in FIG. 17, a region where the GST layer 82 of FIG. 16 is formed and a region covered by the silicon oxide layer 80 around the GST layer 82 are selected as sample regions. An arbitrary first point #1 is set in the region where the GST layer 82 is formed, and an arbitrary second point #2 is set around the GST layer 82. A component analysis at the first and second points #1 and #2 is performed. An SEM-EDX was used for the component analysis.

FIG. 18 is a graph showing the analysis result of the component at the first point #1 of FIG. 17, and FIG. 19 is a graph showing the analysis result component of the at the second point #2.

Referring to FIG. 18, a plurality of peaks were observed at the first point #1. As shown, the highest peak 90 is formed due to Si. A small first peak G1 on the left side of the highest peak 90 is formed due to Ge. Second and third peaks G2 and G3 on the right side of the highest peak 90 are formed due to Sb and Te, respectively.

Referring to FIG. 19, according to the component analysis result at the second point #2, a large peak 100 is observed to coincide with the highest peak 90 in FIG. 18. Accordingly, the relatively large peak 100 illustrated in FIG. 100 is formed due to Si. The first to third peaks G1 through G3 in FIG. 18 do not occur on the left and right sides of the large peak 100 in FIG. 19.

The component analysis results of FIGS. 18 and 19 indicates that the GST layer is formed only at the region of the first point #1 in FIG. 17. Moreover, these results indicate that the phase change layer is selectively formed only on a desired region.

In example embodiments, phase change layers may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change layers may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change layers may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change layers may also be one selected from a binary phase-change chalcogenide alloy and a quaternary phase-change chalcogenide alloy. Example binary phase-change chalcogenide alloys may include at least one of Ga—Sb, In—Sb, In—Se, $Sb_2$—$Te_3$ and Ge—Te alloys; example quaternary phase-change chalcogenide alloys may include at least one of an Ag—In—Sb—Te, (Ge—Sn)—Sb—Te, Ge—Sb—(Se—Te) and $Te_{81}$—$Ge_{15}$—$Sb_2$—$S_2$ alloy, for example.

Alternatively, phase change layers may be made of a transition metal oxide having multiple resistance states, as described above. For example, phase change layers may be made of at least one material selected from the group consisting of MO, $TiO_2$, HfO, $Nb_2O_5$, ZnO, $WO_3$, and CoO or GST ($Ge_2Sb_2Te_5$) or PCMO($Pr_xCa_{1-x}MnO_3$). Additionally, phase change layers may be a chemical compound including one or more elements selected from the group consisting of S, Se, Te, As, Sb, Ge, Sn, In and Ag.

In methods of manufacturing phase change memory devices according to example embodiments, the selective growth of the phase change layer may enable the phase change layer to be self-aligned without having to use an additional mask.

As described above, because a phase change layer is selectively grown, etching of the phase change layer (e.g., etching of the side wall of the phase change layer) need not be performed. Therefore, when using the phase change memory device according to example embodiments, deterioration of characteristics of phase change memory devices caused by the etching of the phase change layer may be suppressed and/or prevented, and potential problems caused by penetration of an etching gas into the phase change layer and the interface there below may be suppressed and/or prevented.

Additionally, in methods of manufacturing phase change memory devices, after selectively growing the phase change layer, an insulation layer may be formed around the grown phase change layer. As a result, seams and/or voids formed at the phase change layer may be suppressed and/or prevented.

In methods of manufacturing phase change memory devices according to example embodiments, even if the phase change layer is formed in the contact hole, the lower electrode contact layer may also be formed in the contact hole. As a result seams and/or voids formed in the phase change layer may be suppressed and/or reduced.

While example embodiments have been particularly shown and described with reference to the example embodiments shown in the figures, it will be understood by one of ordinary skill in the art that various changes in form and details may be made therein without departing from the spirit and scope of the present invention as defined by the following claims.

What is claimed is:

1. A method of manufacturing a phase change memory device, the method comprising:
   forming an insulating interlayer on a semiconductor substrate including a switching device, the insulating interlayer being formed to cover the switching device;
   forming a first lower electrode connected to the switching device; and
   selectively growing a phase change layer on the first lower electrode wherein the phase change layer is not electrically connected to a second lower electrode adjacent to the first lower electrode.

2. The method of claim 1, wherein the phase change layer is at least one of a Ge—Sb—Te layer, a As—Sb—Te layer, a As—Ge—Sb—Te layer, a Sn—Sb—Te layer, a (the group 5A element)-Sb—Te layer, a (the group 6A element)-Sb—Te layer, a (the group 5A element)-Sb—Se layer, and a (the group 6A element)-Sb—Se layer.

3. The method of claim 1, wherein before the forming of the insulating interlayer, the method further includes,
   forming a transistor as the switching device on the substrate,
   forming a lower insulating interlayer covering the transistor,
   forming a contact pad layer in the lower insulating interlayer, the contact pad layer being connected to one of a source and a drain of the transistor, and
   forming a conductive plug electrically connecting the contact pad layer and the first lower electrode.

4. The method of claim 1, wherein the growing the phase change layer further includes,
   forming a seed layer on the first lower electrode such that the seed layer is not electrically connected to the second lower electrode adjacent to the first lower electrode, and
   the selectively growing the phase change layer includes selectively growing the phase change layer on the seed layer.

5. The method of claim 4, wherein the seed layer is at least one of a chalcogenide layer, an electrically conductive transition metal layer, a transition metal nitride layer, a ternary nitride layer, and a transition metal oxide layer.

6. The method of claim 4, further including,
   forming an insulation layer surrounding side walls of the phase change layer and the seed layer after the selectively growing the phase change layer.

7. The method of claim 6, wherein the forming of the insulation layer includes,
   forming an insulation layer covering the phase change layer and the seed layer, and
   planarizing a top surface of the insulation layer to expose the phase change layer.

8. The method of claim 1, wherein forming the first lower electrode further includes,
   forming a connection portion on the switching device, and
   forming a lower electrode contact layer on the connection portion,
   wherein the selectively growing the phase change layer includes selectively growing phase change layer directly on the lower electrode contact layer.

9. The method of claim 8, wherein the lower electrode contact layer is at least one of a chalcogenide layer, an electrically conductive transition metal layer, a transition metal nitride layer, a silicide layer, a ternary nitride layer, and a transition metal oxide layer.

10. The method of claim 9, wherein the chalcogenide layer is at least one of a Ge layer, a Sb layer, a GeTe layer, a GeSbTe layer, a Ge—Sb—Te—N layer, a As—Sb—Te—N layer, a As—Ge—Sb—Te—N layer, a Sn—Sb—Te—N layer, a (the group 5A element)-Sb—Te—N layer, a (the group 6A element)-Sb—Te—N layer, a (the group 5A element)-Sb—Se—N layer, and a (the group 6A element)-Sb—Se—N layer.

11. The method of claim 8, further comprising:
   forming an upper insulating interlayer including a contact hole,
   wherein the forming of the first lower electrode and the selectively growing the phase change layer include forming the lower electrode contact layer and the phase change layer to fill the contact hole.

12. The method of claim 11, further comprising:
   planarizing the phase change layer after sequentially filling the contact hole with the lower electrode contact layer and the phase change layer.

13. The method of claim 7, wherein after the planarizing the top surface of the insulation layer, the method further includes, sequentially forming a barrier layer covering an exposed portion of the phase change layer and an upper electrode on the insulation layer.

* * * * *